United States Patent [19]

Ogata et al.

[11] Patent Number: 4,997,673
[45] Date of Patent: Mar. 5, 1991

[54] METHOD OF FORMING ALUMINUM NITRIDE FILMS BY ION-ASSISTED EVAPORATION

[75] Inventors: Kiyoshi Ogata; Yasunori Andoh, both of Kyoto, Japan

[73] Assignee: Nissin Electric Co., Ltd., Kyoto, Japan

[21] Appl. No.: 465,610

[22] Filed: Jan. 18, 1990

Related U.S. Application Data

[63] Continuation of Ser. No. 242,835, Sep. 9, 1988, abandoned.

[30] Foreign Application Priority Data

Sep. 10, 1987 [JP] Japan .................. 62-227298

[51] Int. Cl.⁵ ............................. B05D 3/06
[52] U.S. Cl. ........................ 427/38; 427/42; 427/248.1; 427/126.1
[58] Field of Search ............ 427/38, 42, 255, 126.1, 427/248.1

[56] References Cited

U.S. PATENT DOCUMENTS 4,634,600 1/1987 Shimizu et al. .................. 427/38
4,759,948 7/1988 Hashimoto et al. ............... 427/38

FOREIGN PATENT DOCUMENTS 62-87496 4/1987 Japan .

OTHER PUBLICATIONS

Targove et al, "Preparation of Aluminum Nitride and Oxynitride Thin Films by Ion-Assisted Deposition", MRS (Anaheim, CA), Apr. 21-23, 1987, pp. 311-316.

Primary Examiner—Shrive Beck
Assistant Examiner—Roy V. King
Attorney, Agent, or Firm—Finnegan, Henderson, Farabow, Garrett, and Dunner

[57] ABSTRACT

Method of forming aluminum nitride film on a substrate by subjecting the substrate to aluminum evaporation and nitrogen ion irradiation in a vacuum. Defects in the aluminum nitride film due to ion irradiation is minimized by irradiating the substrate with low energy nitrogen ions, i.e., nitrogen ions having an energy level no higher than 1 KeV. The particle ratio (composition ratio of Al/N) used in forming the aluminum nitride film is between 0.5 to 2.0.

5 Claims, 3 Drawing Sheets

METHOD OF FORMING ALUMINUM NITRIDE FILMS BY ION-ASSISTED EVAPORATION

This application is a continuation of application Ser. No. 242,835, filed Sept. 9, 1988, now abandoned.

BACKGROUND OF THE INVENTION

1. Field of the Invention

The present invention relates to a method of forming aluminum nitride (AlN) film on the surface of substrates and more particularly relates to a method of forming aluminum nitride (AlN) film on the surface of substrates for use in the manufacture of electronic circuit substrates, optical parts and components, magnetic recording media and related articles of manufacture.

2. Description of the Prior Art

Several methods of forming aluminum nitride film on the surface of substrates have been proposed One method comprises chemical-vapor deposition (CVD) using reactive gas, for example, $AlCl_3 + NH_3$ or $AlBr_3 + NH_3$. Another method comprises ion plating in which aluminum is ionized, for example, in an $NH_3$ gas atmosphere and deposited on a substrate using an electric field Still another method involves the sputtering method in which an aluminum target is sputtered, for example, in an $NH_3$ gas atmosphere.

In all of these prior art methods, however, it is generally necessary to heat the substrate to a high temperature, i.e. approximately 1000° C. in order to obtain a high-quality aluminum nitride film. Accordingly, the choice of materials which are suitable for use as substrates is severely limited Another drawback of these prior art methods is the problem associated with impurities. Gaseous impurities such as $Cl_2$ and $H_2$ are apt to become mixed and incorporated into the aluminum nitride film. Additionally, unionized aluminum may be taken into the aluminum nitride film, particularly in the ion plating method. These impurities cause changes in the composition ratio of aluminum (Al) and nitrogen (N) in the aluminum nitride film and thereby deteriorate the various physical properties of the aluminum nitride film, such as, for example, optical characteristics and electrical resistivity. The consequence is that the desired aluminum nitride film is not produced, and the aluminum nitride film that is formed has unpredictable and undesirable physical characteristics.

SUMMARY OF THE INVENTION

An object of the present invention is a method of forming high performance aluminum nitride film on substrates in which the foregoing problems and drawbacks of the prior art are avoided.

Another object of the present invention is an efficient method of forming aluminum nitride film on substrates which would obviate the necessity for heating or cooling the substrate.

Still a further object of the present invention is a method of forming aluminum nitride film on a large variety of substrates .

In order to achieve the above objects and in accordance with the purposes of the invention, as embodied and broadly described herein, the method of forming aluminum nitride film according to the present invention comprises placing a substrate in a vacuum, subjecting the substrate to aluminum evaporation and to nitrogen ion irradiation either simultaneously or alternately with the evaporation, the energy of the nitrogen ions not exceeding 1 KeV.

It has been discovered that if a substrate is subjected to aluminum evaporation and nitrogen ion irradiation under the foregoing conditions, aluminum nitride film exhibiting superior physical properties, for example, excellent optical characteristics and high electrical resistivity, can be formed on the surface of a substrate at low temperatures, for example, at room temperature, on a consistent and reliable basis.

BRIEF DESCRIPTION OF THE DRAWINGS

These and other features, objects and advantages of the present invention will be apparent from the following detailed description with reference to the accompanying drawings in which.

DETAILED DESCRIPTION OF THE PREFERRED EMBODIMENT

Reference will now be made in detail to the present preferred embodiment of the invention, an example of which is illustrated in the accompanying drawings.

Figure 1:
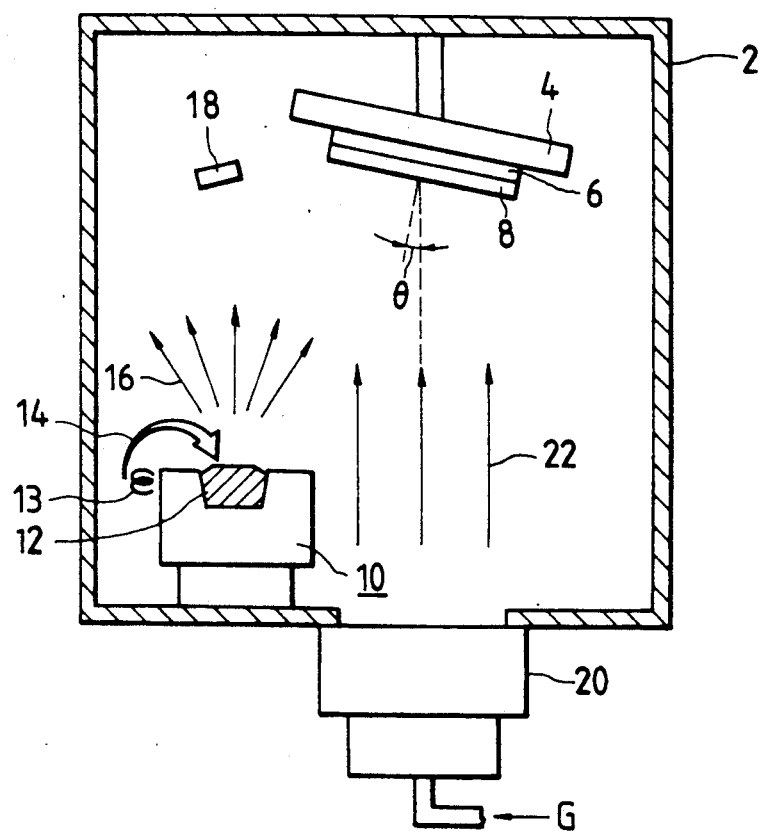
FIG. 1 is a schematic view showing an example of an apparatus used to carry out an embodiment of the present invention.

Referring to FIG. 1, which is a schematic view showing an example of an apparatus used in a preferred embodiment of the present invention, a vacuum vessel 2 is disclosed wherein substrate 6 is fixed on a holder 4 so as to face an evaporation source 10 and an ion source 20. The evaporation source 10 may comprise an electronic beam evaporation source having aluminum metal as the evaporation material 12. The surface of the substrate 6 is subject to evaporation with aluminum 16, which is obtained by heat vaporization of the aluminum metal using an electron beam 14 emitted from an electron gun 13. The evaporation rate of the aluminum 16 onto the substrate 6 or the film thickness of the thin film formed on the substrate 6 is measured by a film thickness monitor 18.

In the preferred embodiment of the present invention, the ion source 20 is of the bucket type in which a multipolar magnetic field is used to seal plasma. It is therefore possible to ionize the supplied nitrogen gas G and emit nitrogen ions (nitrogen ion beams) 22 uniformly toward the surface of the substrate 6 across a large area to make it possible to perform large-area processing on the substrate. Alternatively, an ion source of another type may be used in place of the foregoing bucket-type ion source.

In forming an aluminum nitride film 8 on a substrate 6 according to the present method, after a vacuum is attained inside of the vacuum vessel 2, for example, $10^{-5}$ - $10^{-7}$ Torr, the substrate 6 is subjected to evaporation with the aluminum 16 from the evaporation source 10 and continuous or intermittent irradiation with the nitrogen ions 22 from the ion source 20. The irradiation of the substrate 6 with nitrogen ions 22 may be conducted either simultaneously or alternately with the evaporation. The particle ratio (composition ratio of Al/N), that is, the ratio of the aluminum (Al) evaporated on the surface of the substrate 6 to the emitted nitrogen ions (N) radiated on the surface of the same substrate 6, is selected to be a value within a range, for example, from about 0.5 to 2.0, and preferably from 1.0 to 1.5. As a result, the evaporated aluminum 16 and the radiated nitrogen ions 22 combine to form an aluminum nitride film 8 on the surface of the substrate 6.

It is preferable to select the energy of the nitrogen ions 22 to be not higher than 1 KeV but greater than zero. It is more preferable to select the energy of the nitrogen ions 22 to be within a range of from about 200 eV to 800 eV. Selection of the energy level of the nitrogen ions in such manner minimizes the risk of non-uniform or irregular irradiation and therefore minimizes the risk of defective film composition and defective surface characteristics.

Figure 2:
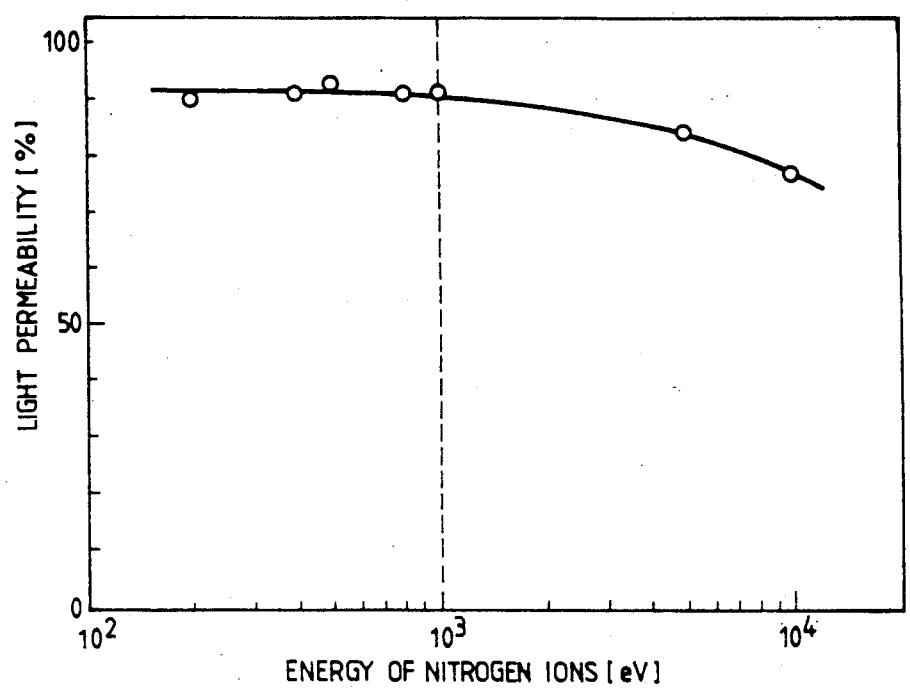
FIG. 2 is a graph showing an example of the relationship between the energy of nitrogen ions in forming aluminum nitride film and light permeability of the aluminum nitride film within a range from the visible region to the near-infrared region while varying the energy of the nitrogen ions.
Figure 3:
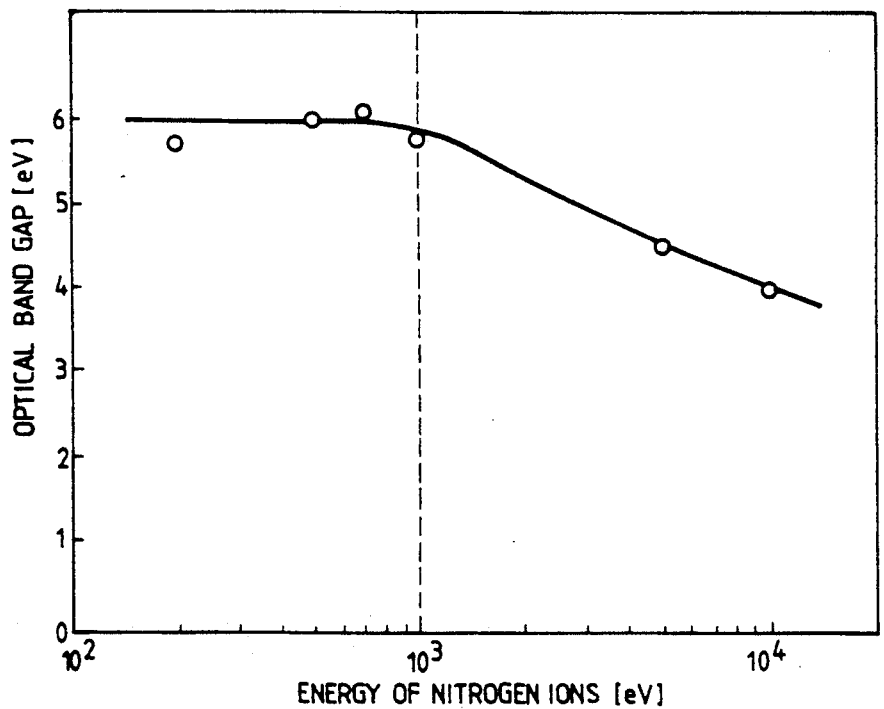
FIG. 3 is a graph showing an example of the relationship between the energy of nitrogen ions in forming aluminum nitride film and an optical band gap of the aluminum nitride film while varying the energy of the nitrogen ions.

Referring to FIGS. 2 and 3, the selection of the energy of the nitrogen ions 22 will now be described. FIG. 2 is a graph showing an example of the relationship between the energy of the nitrogen ions 22 in forming the aluminum nitride film 8 and light permeability of the aluminum nitride film 8 within a range of from the visible region to the near-infrared region while varying the energy of the nitrogen ions 22. FIG. 3 is a graph showing an example of the relationship between the energy of the nitrogen ions 22 in the same case as FIG. 2 and an optical band gap of the aluminum nitride film 8. In either case, the aluminum nitride film 8 was formed under the condition that the foregoing particle ratio (composition ratio of Al/N) with respect to the substrate 6 was held at a constant value of 1.5.

As seen in FIG. 2, the aluminum nitride film 8 formed according to the present method has a light permeability of about 90% or more when the energy of the nitrogen ions 22 is not higher than 1 KeV. Further, as seen in FIG. 3, the optical band gap of the present aluminum nitride film 8 is approximate to the theoretical value of 6.2 eV when the energy of the nitrogen ions 22 is not higher than 1 KeV.

When the energy of the nitrogen ions 22 exceed 1 KeV, the light permeability and optical band gap of the aluminum nitride film 8 has a tendency to decrease. It is considered that these decreases in light permeability and optical band gap are caused by an increase in defective portions in the aluminum nitride film 8 generated by irradiation with the higher energy nitrogen ions 22.

Accordingly, given that higher electrical resistivity values are obtained from the aluminum nitride film as the optical band gap more closely approximates the theoretical value of 6.2 eV, maintaining the energy of the nitrogen ions at a level not higher than 1 KeV produces an aluminum nitride film having physical properties superior to those produced according to the prior art methods.

Figure 4:
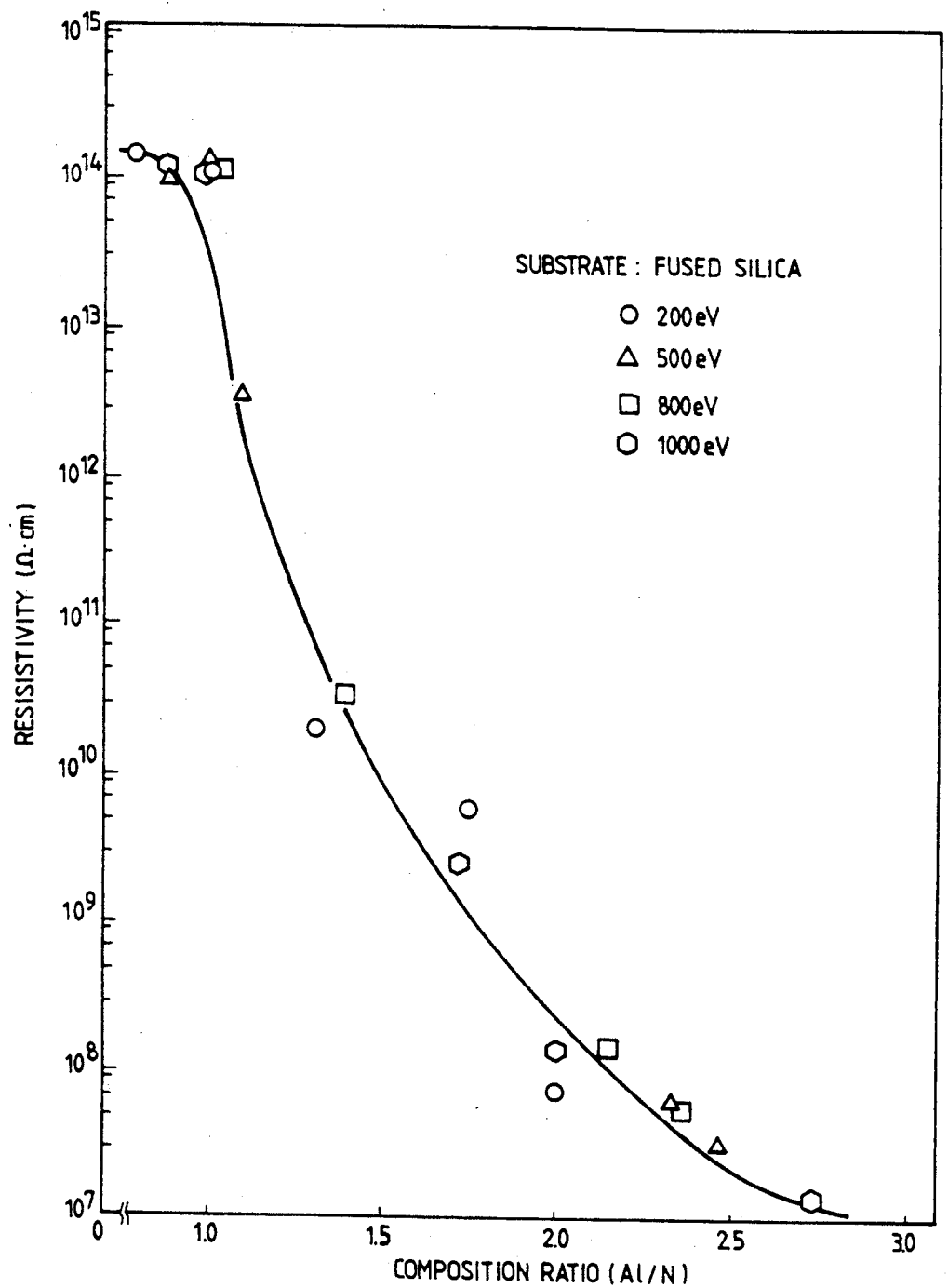
FIG. 4 is a graph showing the changes in electrical resistivity ($\Omega \cdot cm$) of an aluminum nitride film relative to changes in the aluminum (Al) and nitrogen (N) composition ratio (Al/N) of the aluminum nitride film, in which the abscissa and the ordinate represent the composition ratio (Al/N) and the electric resistivity ($\Omega \cdot cm$), respectively.

FIG. 4 shows the electric resistivity of the aluminum nitride film 8 formed by means of nitrogen ion irradiation and aluminum evaporation. The aluminum nitride film 8 was formed using nitrogen ions 22 having energy levels between 200 eV-1 KeV and a particle ratio (composition ratio of Al/N) between 0.5-2.0. In FIG. 4, the abscissa represents the relationship between the electric resistivity and the actual composition ratio of the aluminum nitride film 8 produced in accordance with the present invention. The graph in FIG. 4 shows that when the energy of the nitrogen ions 22 is not higher than 1 KeV, the electric resistivity changes correspond directly to the changes in the composition ratio (Al/N) of the aluminum nitride film 8 independent of the energy level of the nitrogen ions. When the composition ratio was 1.0, the electric resistivity took the highest value of $10^{14} \Omega \cdot cm$. The graph shows that when the transportation ratio Al/N (one of the film forming conditions) was about 1.0 or less, the composition ratio was 1.0. In other words, an aluminum nitride film 8 of high resistance can be formed if the film 8 is formed under the conditions that the energy of the nitrogen ions 22 is not higher than 1 KeV and the transportation ratio is not larger than 1.0.

In order to prevent sputtering on the aluminum nitride film 8 from the irradiating nitrogen ions 22, it is preferable to select an incident angle of the nitrogen ions 22 into the substrate 6 (the angle to a normal on the surface of the substrate 6) to be a value within a range of, for example, from about 0° to 60°.

Further, in forming the film 8, the substrate 6 may optionally be heated by heating means (not shown) or cooled by cooling means (not shown), as appropriate. If the substrate 6 is heated, not only can the formation of aluminum nitride be promoted by thermal excitation but defective portions generated in the aluminum nitride film 8 can also be removed in forming the film 8. If the substrate 6 is cooled, on the other hand, it can be expected to perfectly prevent deformation of the substrate 6 due to heat.

In the film forming method according to the present invention, aluminum nitride film 8 can be formed at a low temperature, i.e. at room temperature. Accordingly, it is not necessary to heat the substrate to a high temperature. By using low energy nitrogen ions 22, e.g., not higher than 1 KeV, heating of the substrate 6 due to irradiation with nitrogen ions 22 can be suppressed by using nitrogen ions 22 having low energy not higher than 1 KeV. Accordingly, the range of material which can be used as the substrate 6 is considerably widened.

Further, aluminum nitride film 8 which is superior in various physical properties, for example, optical characteristics such as light permeability and optical band gap and electric resistivity, can be formed on a consistent and reliable basis based upon the following observations and reasons:

(1) The particle ratio (composition ratio of Al/N) of the aluminum nitride film can be closely controlled by regulating the irradiation beams of nitrogen ions 22 and the quantity of evaporation of the aluminum 16. Additionally, the degree of sputtering against the evaporated aluminum 16 is minimized to a negligible degree since low energy nitrogen ions 22 are used;

(2) Defects in the aluminum nitride film 8 due to ion irradiation is reduced and the degree of sputtering can be minimized by using low energy nitrogen ions 22. The net result is that an aluminum nitride film 8 having a smooth surface is formed on the substrate;

(3) Contamination of the aluminum nitride film 8 by impurities is kept to a minimum level since the aluminum nitride film 8 is formed by the transport of only the necessary particles, aluminum and nitrogen ions, to the substrate in a vacuum.

According to the present invention, aluminum nitride film that is superior in various physical properties such as optical characteristics and electric resistivity can be formed on a consistent and reliable basis by means of aluminum evaporation and nitrogen ion irradiation under the condition that the energy of nitrogen ions is selected to be 1 KeV or less.

Further, the range and choice of materials which can be used as the substrate is considerably enlarged since the aluminum nitride film may be formed at low temperatures, for example, at room temperature instead of the high temperatures of the prior art methods.

It will be apparent to those skilled in the art that various modifications and variations can be made in the method of the present invention without departing from the scope or spirit of the invention. Thus, it is intended that the present invention cover the modifications and variations of this invention provided they come within the scope of the appended claims and their equivalents.

What is claimed is:

1. A method of forming an aluminum nitride film on a substrate without heating comprising:
   placing the substrate at room temperature in a vacuum;
   subjecting the substrate at said room temperature to aluminum evaporation; and
   subjecting the substrate at said room temperature to nitrogen ion irradiation, wherein the energy of the nitrogen ion irradiation is higher than zero but not higher than 1 KeV.

2. The method according to claim 1, wherein the nitrogen ion irradiation of the substrate is conducted simultaneously with the aluminum evaporation.

3. The method according to claim 1, wherein the nitrogen ion irradiation of the substrate is conducted in alternating manner with the aluminum evaporation.

4. The method according to claim 1, wherein the ratio of aluminum evaporated on the substrate to the nitrogen ions irradiated on the substrate is a value selected from a range of 0.5 to 2.0.

5. The method according to claim 4, wherein the ratio is a value selected from a range of 1.0 to 1.5.

* * * * *